United States Patent
Choi et al.

(10) Patent No.: US 8,841,006 B2
(45) Date of Patent: Sep. 23, 2014

(54) MAGNETIC TUNNEL JUNCTION DEVICE AND METHOD FOR MANUFACTURING THE SAME

(75) Inventors: Gyung-Min Choi, Seoul (KR); Byoung Chul Min, Gwangmyeong-si (KR); Kyung Ho Shin, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 469 days.

(21) Appl. No.: 12/658,853

(22) Filed: Feb. 16, 2010

(65) Prior Publication Data
US 2011/0045320 A1   Feb. 24, 2011

(30) Foreign Application Priority Data
Aug. 21, 2009   (KR) .................. 10-2009-0077492

(51) Int. Cl.
| | | |
|---|---|---|
| G11C 11/02 | (2006.01) | |
| H01F 10/32 | (2006.01) | |
| H01F 10/14 | (2006.01) | |
| G11C 11/15 | (2006.01) | |
| B82Y 25/00 | (2011.01) | |
| B82Y 40/00 | (2011.01) | |
| H01F 41/30 | (2006.01) | |
| H01L 43/10 | (2006.01) | |
| H01L 43/12 | (2006.01) | |
| G01R 33/09 | (2006.01) | |
| H01F 10/12 | (2006.01) | |

(52) U.S. Cl.
CPC .......... *H01F 10/3254* (2013.01); *G01R 33/098* (2013.01); *G01R 33/091* (2013.01); *H01F 10/14* (2013.01); *G11C 11/15* (2013.01); *B82Y 25/00* (2013.01); *B82Y 40/00* (2013.01); *H01F 41/307* (2013.01); *H01L 43/10* (2013.01); *H01L 43/12* (2013.01); *H01F 10/123* (2013.01)
USPC .......... 428/812; 365/158; 365/173; 360/324.2

(58) Field of Classification Search
CPC ........................ G11C 11/1695; G11C 11/2295
See application file for complete search history.

(56) References Cited

U.S. PATENT DOCUMENTS

| | | | | |
|---|---|---|---|---|
| 6,845,038 | B1 * | 1/2005 | Shukh | 365/171 |
| 6,846,543 | B2 * | 1/2005 | Bian et al. | 428/836.3 |
| 7,596,015 | B2 * | 9/2009 | Kitagawa et al. | 365/158 |
| 7,663,197 | B2 * | 2/2010 | Nagase et al. | 257/421 |
| 7,732,881 | B2 * | 6/2010 | Wang | 257/421 |

(Continued)

FOREIGN PATENT DOCUMENTS

| | | |
|---|---|---|
| JP | 2008-098523 | 4/2008 |
| JP | 2009-081216 | 4/2009 |

(Continued)

*Primary Examiner* — Kevin Bernatz
(74) *Attorney, Agent, or Firm* — Lexyoume IP Meister, PLLC

(57) ABSTRACT

The present invention relates to a magnetic tunnel junction device and a manufacturing method thereof. The magnetic tunnel junction device includes: i) a first magnetic layer including a compound having a chemical formula of $(A_{100-x}B_x)_{100-y}C_y$; ii) an insulating layer deposited on the first magnetic layer; and iii) a second magnetic layer deposited on the insulating layer and including a compound having a chemical formula of $(A_{100-x}B_x)_{100-y}C_y$. The first and second magnetic layers have perpendicular magnetic anisotropy, A and B are respectively metal elements, and C is at least one amorphizing element selected from a group consisting of boron (B), carbon (C), tantalum (Ta), and hafnium (Hf).

6 Claims, 7 Drawing Sheets

(56) References Cited

U.S. PATENT DOCUMENTS

| | | | |
|---|---|---|---|
| 8,648,589 B2* | 2/2014 | Carey et al. | 324/179 |
| 2002/0058158 A1* | 5/2002 | Odagawa et al. | 428/692 |
| 2004/0196593 A1* | 10/2004 | Yasui et al. | 360/135 |
| 2005/0202287 A1* | 9/2005 | Lu et al. | 428/831.2 |
| 2007/0086121 A1 | 4/2007 | Nagase et al. | |
| 2008/0088980 A1 | 4/2008 | Kitagawa et al. | |
| 2008/0180991 A1 | 7/2008 | Wang | |
| 2009/0080124 A1 | 3/2009 | Yoshikawa et al. | |
| 2009/0274931 A1* | 11/2009 | Qiu et al. | 428/814 |
| 2010/0096716 A1* | 4/2010 | Ranjan et al. | 257/421 |
| 2010/0128400 A1* | 5/2010 | Lin | 360/319 |
| 2010/0200124 A1* | 8/2010 | Qiu et al. | 148/527 |

FOREIGN PATENT DOCUMENTS

| | | |
|---|---|---|
| JP | 2009-081314 | 4/2009 |
| JP | 2009-81315 | 4/2009 |
| JP | 2009-212156 | 9/2009 |
| KR | 10-2009-0031993 | 3/2009 |
| WO | 2009038105 | 3/2009 |

* cited by examiner

MAGNETIC TUNNEL JUNCTION DEVICE AND METHOD FOR MANUFACTURING THE SAME

CROSS-REFERENCE TO RELATED APPLICATION

This application claims priority to and the benefit of Korean Patent Application No. 10-2009-0077492 filed in the Korean Intellectual Property Office on Aug. 21, 2009, the total contents of which are incorporated herein by reference.

BACKGROUND OF THE INVENTION (a) Field of the Invention

The present invention relates to a magnetic tunnel junction device and a method for manufacturing the same. More particularly, it relates to a magnetic tunnel junction device using an amorphous material with perpendicular magnetic anisotropy, and a method of manufacturing the same.

(b) Description of the Related Art

Recently, various types of memories have been developed. For example, a magnetic random access memory (MRAM), a phase-change random access memory (PRAM), and a resistive random access memory (RRAM) have been developed. The MRAM uses a magnetic tunnel junction (MJT) element as a data storage element. The magnetic tunnel junction element included in a memory cell is based on ferromagnetic tunnel junction properties. The magnetic tunnel junction element consists of two magnetic layers separated by an insulating layer, and the current flows in the insulating layer through the tunneling mechanism. Here, when the relative magnetization directions of the two magnetic layers are parallel to each other, the magnetic tunnel junction element has low resistance. In contrast, when the two magnetic layers have an antiparallel magnetization configuration, the magnetic tunnel junction element has high resistance. The low resistance and the high resistance indicate digital data, respectively, corresponding to 0 and 1.

Thermal stability is defined as the ability of retaining the digital data for a long period of time. The thermal stability is proportional to anisotropy energy of the magnetic layer of the magnetic tunnel junction element. In the majority of cases, the ferromagnetic materials used in the magnetic tunnel junction element have an in-plane magnetic anisotropy, for example, represented by shape anisotropy energy, and therefore the total anisotropy energy is small. In order to solve this problem, a ferromagnetic material with perpendicular magnetic anisotropy, for example, represented by high crystalline anisotropy energy, is used as a material of the magnetic tunnel junction element. Accordingly, the total anisotropy energy of the magnetic tunnel junction device is large so that the magnetic tunnel junction device can have superior thermal stability with a small volume.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a magnetic tunnel junction device having advantages of increasing a read signal value and improving thermal stability. In addition, the present invention provides a manufacturing method of the magnetic tunnel junction device.

A magnetic tunnel junction device according to an exemplary embodiment of the present invention includes: i) a first magnetic layer including a compound having a chemical formula of $(A_{100-x}B_x)_{100-y}C_y$; ii) an insulating layer deposited on the first magnetic layer; and iii) a second magnetic layer deposited on the insulating layer and including a compound having a chemical formula of $(A_{100-x}B_x)_{100-y}C_y$. The first and second magnetic layers have perpendicular magnetic anisotropy, and A and B are metal elements and C is at least one amorphizing element selected from a group consisting of boron (B), carbon (C), tantalum (Ta), and hafnium (Hf).

A may be at least one element selected from a group consisting of iron (Fe), cobalt (Co), nickel (Ni), manganese (Mn), and chrome (Cr). B may be at least one element selected from a group consisting of platinum (Pt), palladium (Pd), rhodium (Rh), gold (Au), mercury (Hg), and aluminum (Al). The insulating layer includes a compound having a chemical formula of $D_{100-z}E_z$, and D may be at least one element selected from a group consisting of lithium (Li), beryllium (Be), sodium (Na), magnesium (Mg), niobium (Nb), titanium (Ti), vanadium (V), tantalum (Ta), barium (Ba), palladium (Pd), zirconium (Zr), holmium (Ho), potassium (K), and silver (Ag), and E is at least one element selected from a group consisting of oxygen (O), nitrogen (N), carbon (C), hydrogen (H), selenium (Se), chlorine (Cl), and fluorine (F). At least one of the first and second magnetic layers may have a cubic or tetragonal structure.

The magnetic tunnel junction device according to the exemplary embodiment of the present invention may further include i) a first in-plane magnetic layer with in-plane magnetic anisotropy deposited between the second magnetic layer and the insulating layer and ii) a first seed layer, for inducing the formation of crystalline structure, deposited on the second magnetic layer. The first in-plane magnetic layer with in-plane magnetic anisotropy may include at least one element selected from a group consisting of Fe, CoFe, and CoFeB. When the compound included at least one of the first and second perpendicular magnetic layers has a chemical formula of $(Fe_{100-x}Pd_x)_{100-x}B_x$ or $(Fe_{100-x}Pt_x)_{100-x}B_x$, the first seed layer for inducing the formation of crystalline structure may include at least one element selected from a group consisting of Pd, Pt, Au, and Fe. The magnetic tunnel junction device according to the exemplary embodiment of the present invention may further include i) a second in-plane magnetic layer with in-plane magnetic anisotropy deposited between the first magnetic layer and the insulating layer and ii) a second seed layer, for inducing the formation of crystalline structure, deposited under the first magnetic layer.

A magnetic tunnel junction device according to another exemplary embodiment of the present invention includes: i) a seed layer for inducing the formation of crystalline structure; ii) a perpendicular magnetic layer with perpendicular magnetic anisotropy deposited on the seed layer and including a compound having a chemical formula of $(A_{100-x}B_x)_{100-y}C_y$; iii) an in-plane magnetic layer with in-plane magnetic anisotropy deposited on the perpendicular magnetic layer; iv) an insulating layer deposited on the in-plane magnetic layer; v) an in-plane magnetic anisotropic layer deposited on the insulating layer; and vi) a perpendicular magnetic layer with perpendicular magnetic anisotropy deposited on the in-plane magnetic layer. A may be at least one element selected from a group consisting of iron (Fe), cobalt (Co), nickel (Ni), manganese (Mn), and chrome (Cr), B is at least one element selected from a group consisting of platinum (Pt), palladium (Pd), rhodium (Rh), gold (Au), mercury (Hg), and aluminum (Al), and C is at least one element selected from a group consisting of boron (B), carbon (C), tantalum (Ta), and hafnium (Hf).

A manufacturing method of a magnetic tunnel junction device according to another exemplary embodiment of the present invention includes: i) providing a first magnetic layer including an amorphizing element; ii) providing an insulating layer on the first magnetic layer; iii) providing a second magnetic layer including an amorphizing element on the insulating layer; and iv) crystallizing the first and second magnetic layers by performing annealing on the first magnetic layer, the insulating layer, and the second magnetic layer.

In the providing of the first magnetic layer and in the providing of the second magnetic layer, the first and second magnetic layers may respectively include a compound having a chemical formula of $(A_{100-x}B_x)_{100-y}C_y$, and A may be at least one element selected from a consisting of iron (Fe), cobalt (Co), nickel (Ni), manganese (Mn), and chrome (Cr), B may be at least one element selected from a group consisting of platinum (Pt), palladium (Pd), rhodium (Rh), gold (Au), mercury (Hg), and aluminum (Al), and C may be at least one amorphizing element selected from a group consisting of boron (B), carbon (C), tantalum (Ta), and hafnium (Hf). In the crystallizing of the first and second magnetic layers, the first and second magnetic layers may have perpendicular magnetic anisotropy. In the crystallizing of the first and second magnetic layers, the annealing may be performed on the first magnetic layer, the insulating layer, and the second magnetic layer at 300° C. to 600° C.

The manufacturing method according to the other exemplary embodiment of the present invention may further include i) providing an in-plane magnetic layer with in-plane magnetic anisotropy between the second magnetic layer and the insulating layer and ii) providing a seed layer, for inducing the formation of crystalline structure, on the second magnetic layer. The manufacturing method according to the other exemplary embodiment of the present invention may further include i) providing another in-plane magnetic layer with in-plane magnetic anisotropy between the first magnetic layer and the insulating layer and ii) providing a seed layer, for inducing the formation of crystalline structure, under the first magnetic layer.

A manufacturing method of a magnetic tunnel junction device according to another exemplary embodiment of the present invention includes: i) providing a seed layer for inducing the formation of crystalline structure; ii) providing a magnetic layer including a compound having a chemical formula of $(A_{100-x}B_x)_{100-y}C_y$ on the seed layer; iii) providing a first in-plane magnetic layer with in-plane magnetic anisotropy on the magnetic layer; iv) providing an insulating layer on the first in-plane magnetic layer; v) providing a second in-plane magnetic layer with in-plane magnetic anisotropy on the insulating layer; vi) providing a perpendicular magnetic layer with perpendicular magnetic anisotropy on the second in-plane magnetic layer; and vii) crystallizing the magnetic layer by performing annealing on the seed layer, the magnetic layer, the first in-plane magnetic layer with in-plane magnetic anisotropy, the insulating layer, the second in-plane magnetic layer with in-plane magnetic anisotropy, and the perpendicular magnetic layer with perpendicular magnetic anisotropy, In the crystallizing of the magnetic layer, the magnetic layer may have perpendicular magnetic anisotropy and may include a compound having a chemical formula of $(A_{100-x}B_x)_{100-y}C_y$, in which A may be at least one element selected from a group consisting of iron (Fe), cobalt (Co), nickel (Ni), manganese (Mn), and chrome (Cr), B may be at least one element selected from a group consisting of platinum (Pt), palladium (Pd), rhodium (Rh), gold (Au), mercury (Hg), and aluminum (Al), and C may be at least one amorphizing element selected from a group consisting of boron (B), carbon (C), tantalum (Ta), and hafnium (Hf).

According to the present invention, the insulating layer is deposited on the amorphous magnetic layer so that the insulating layer is deposited with low roughness. Accordingly, the magnetic tunnel junction device having a high read signal value can be manufactured. In addition, a crystal structure of the amorphous magnetic layer is recovered through annealing so that it has perpendicular magnetic anisotropy. Accordingly, the magnetic tunnel junction device having higher thermal stability can be manufactured. As a result, the read signal value and thermal stability of the magnetic tunnel junction device can be increased so that the magnetic tunnel junction device can be used in a magnetic random access memory (MRAM) or a high frequency oscillator.

DETAILED DESCRIPTION OF THE EMBODIMENTS

Figure 1:
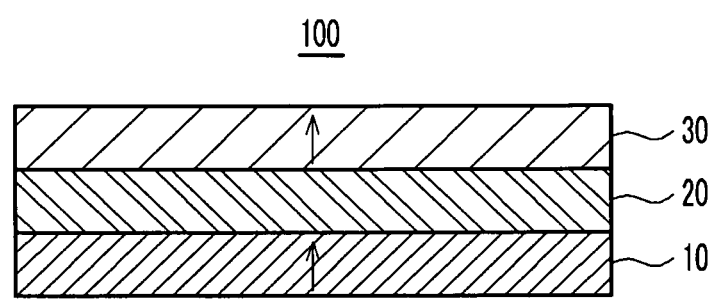
FIG. 1 schematically shows a cross-sectional view of a magnetic tunnel junction device according to a first exemplary embodiment of the present invention.

It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers, and/or sections, they are not limited thereto. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Terminologies used herein are provided to merely mention specific exemplary embodiments and are not intended to limit the present invention. Singular expressions used herein include plurals unless they have definitely opposite meanings. The meaning of "including" used in this specification gives shape to specific characteristics, regions, positive numbers, steps, operations, elements, and/or components, and do not exclude the existence or addition of other specific characteristics, regions, positive numbers, steps, operations, elements, components, and/or groups.

Spatially relative terms, such as "below" and "above" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90 degrees or at other angles, and the spatially relative descriptors used herein are then interpreted accordingly.

All the terminologies including technical terms and scientific terms used herein have the same meanings that those skilled in the art generally understand Terms defined in dictionaries are construed to have meanings corresponding to related technical documents and the present description, and they are not construed as ideal or very official meanings, if not defined.

Exemplary embodiments of the present invention described with reference to cross-sectional views represent ideal exemplary embodiments of the present invention in detail. Therefore, various modification of diagrams, for example, modifications of manufacturing methods and/or specifications, are expected. Accordingly, exemplary embodiments are not limited to specific shapes of shown regions, and for example, also include modifications of the shape by manufacturing. For example, regions shown or described as smooth may generally have rough or rough and nonlinear characteristics. Further, portions shown to have sharp angles may be rounded. Therefore, the regions shown in the drawings are basically just schematic and the shapes thereof are not intended to show the exact shapes of the region and are also not intended to reduce the scope of the present invention.

In the specification, the term "roughness" implies an index indicating height deviation of thin film interface in a perpendicular direction. If the roughness is low, the height of interface is constant, that is, the interface is smooth. By contrast, if the roughness is high, the height deviation of interface is large, that is, the interface is rugged. In order to increase a read signal of an element, it is preferably to form a smooth interface by decreasing the roughness of an insulating layer.

FIG. 1 schematically shows a cross-sectional structure of a magnetic tunnel junction device 100 according to a first exemplary embodiment of the present invention. The cross-sectional structure of the magnetic tunnel junction device 100 shown in FIG. 1 is an example of the present invention, and the present invention is not limited thereto. That is, the cross-sectional structure of the magnetic tunnel junction device 100 can be modified in various shapes.

As shown in FIG. 1, the magnetic tunnel junction device 100 includes a first magnetic layer 10, an insulating layer 20, and a second magnetic layer 30. The first magnetic layer 10 functions as a fixed magnetic layer, and the second magnetic layer 30 functions as a free magnetic layer. In order to increase thermal stability of the magnetic tunnel junction device 100, the first and second magnetic layers 10 and 20 are formed of a ferromagnetic material having perpendicular magnetic anisotropy when an ordered crystal structure such as an $L1_0$ based alloy is recovered.

The first magnetic layer 10 and the second magnetic layer 30 respectively include a material having a chemical formula of $(A_{100-x}B_x)_{100-y}C_y$. Here, A and B may respectively be metal elements. In further detail, A may be iron (Fe), cobalt (Co), nickel (Ni), manganese (Mn), or chrome (Cr). In addition, B may be platinum (Pt), palladium (Pd), rhodium (Rh), gold (Au), mercury (Hg), or aluminum (Al). Further, C may be boron (B), carbon (C), tantalum (Ta), and hafnium (Hf).

An alloy having a chemical formula of $A_{100-x}B_x$ has an ordered structure. The ordered structure may be a cubic structure or a tetragonal structure. The cubic structure may exemplarily include a crystal structure of an $L1_2$ type. In addition, the tetragon structure may exemplarily include a crystal structure of $L1_0$. Before annealing, C is added for the amorphization of an alloy having a chemical formula of $A_{100-x}B_x$. The first magnetic layer 10 and the second magnetic layer 30 may be respectively formed of different materials or the same material.

The insulating layer 20 includes a compound having a chemical formula of $D_{100-z}E_z$. Here, D is at least one element selected from a group consisting of lithium (Li), beryllium (Be), sodium (Na), magnesium (Mg), niobium (Nb), titanium (Ti), vanadium (V), tantalum (Ta), barium (Ba), palladium (Pd), zirconium (Zr), holmium (Ho), potassium (K), and silver (Ag), and E is at least one element selected from a group consisting of oxygen (O), nitrogen (N), carbon (C), hydrogen (H), selenium (Se), chlorine (Cl), and fluorine (F). For example, the insulating layer 20 may be made of magnesium oxide (MgO).

The insulating layer 20 may have a cubic structure. The cubic structure may exemplarily include a crystal structure of a B1 type. The insulating layer may have a (001) orientation along a direction that is perpendicular to a substrate surface of a thin film interface for increasing a read signal value of the magnetic tunnel junction device 100.

As shown by the arrow of FIG. 1, the first magnetic layer 10 and the second magnetic layer 30 have perpendicular magnetic anisotropy after recovering their crystal structures through annealing. Accordingly, the magnetic tunnel junction device 100 having excellent thermal stability and a high read-signal value can be manufactured. Hereinafter, a manufacturing method of the magnetic tunnel junction device 100 of FIG. 1 will be described in further detail with reference to FIG. 2 and FIG. 3.

Figure 2:
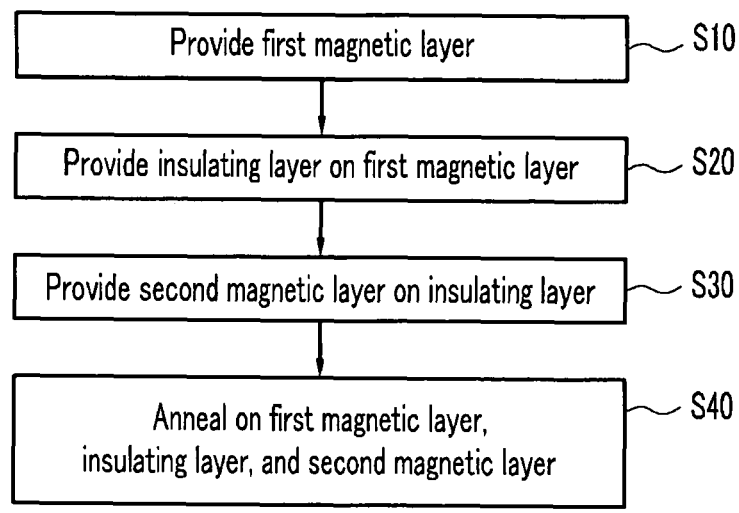
FIG. 2 schematically shows a flowchart of a manufacturing method of the magnetic tunnel junction device of FIG. 1.

FIG. 2 schematically shows a flowchart of a manufacturing method of the magnetic tunnel junction device 100 of FIG. 1.

As shown in FIG. 2, the manufacturing method of the magnetic tunnel junction device 100 includes: i) providing the first magnetic layer 10 of FIG. 1 (S10); ii) providing the insulating layer 20 of FIG. 1 on the first magnetic layer 10 (S20); iii) providing the second magnetic layer 30 on the insulating layer 20 (S30); and annealing the first magnetic layer 10, the insulating layer 20, and the second magnetic layer 30 (S40). The manufacturing method of the magnetic tunnel junction device 100 may further include other steps.

In the step S10, the first magnetic layer 10 is provided for manufacturing the magnetic tunnel junction device 100. The first magnetic layer 10 may be formed by a deposition method. The ferromagnetic material 10 has a perpendicular magnetic anisotropy when it has an ordered crystal structure. However, the first magnetic layer 10 is deposited with adding an amorphizing element to the original ferromagnetic material. Therefore, during the deposition process, the first magnetic layer 10 does not have perpendicular magnetic anisotropy. The first magnetic layer 10 has the perpendicular magnetic anisotropy when its ordered crystal structure is recovered through the annealing of S40.

In the case that the first magnetic layer 10 has a crystal structure, a crystal lattice constant of the magnetic layer 10 may be quite different from that of the insulating layer 20. In this case, the insulating layer 20 having a (001) orientation is difficult to grow on the first magnetic layer 10. In addition, although the insulating layer 20 having the (001) orientation grows on the insulating layer 20, the roughness of the insulating layer 20 is increased because the insulating layer 20 is quite different from the first magnetic layer 10 in crystal lattice constant. Particularly, a lattice constant of an alloy ordered in the type of $L1_0$ having strong perpendicular magnetic anisotropy is quite different from that of magnesium oxide which is used as a material of the insulating layer 20. Therefore, it is difficult to grow magnesium oxide on the $L1_0$-structure alloy with the (001) texture of a crystal structure of B1. Furthermore, although magnesium oxide can be grown on the $L1_0$-structure alloy, the roughness of the insulating layer 20 is increased due to a large difference in lattice constant therebetween, thereby causing a decrease of the read signal value of the magnetic tunnel junction device 100.

However, the first magnetic layer 10 according to the first exemplary embodiment of the present invention is deposited in amorphous state so that the insulating layer 20 is grown well with the (001) orientation on the first magnetic layer 10. In addition, a crystal structure does not exist in the amorphous first magnetic layer 10. Thus, the first magnetic layer 10 and the insulating layer 20 do not have a crystal structure difference so that the roughness of the insulating layer 20 is decreased. Accordingly, the read signal value of the magnetic tunnel junction device 100 can be greatly increased, and the resistance of the magnetic tunnel junction device 100 can be significantly improved.

In the step S20, the insulating layer 20 is formed on the first magnetic layer 10. That is, the insulating layer 20 is deposited with the (001) texture on the first magnetic layer 10. In addition, the roughness of the insulating layer 20 is decreased.

In the step S30, the second magnetic layer 30 is formed on the insulating layer 20. The second magnetic layer 30 is deposited in amorphous state. The second magnetic layer 30 can be manufactured by using the same method as that of the first magnetic layer 10 of the step S10.

Figure 3:
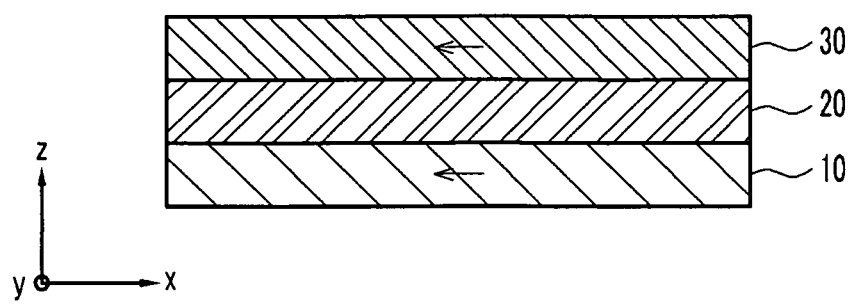
FIG. 3 schematically shows a magnetic tunnel junction device formed of a sequentially stacked first magnetic layer, insulating layer, and second magnetic layer before annealing.

FIG. 3 schematically shows a sequentially stacked first magnetic layer 10, insulating layer 20, and second magnetic layer 30 of the magnetic tunnel junction device before annealing.

Since the first magnetic layer 10 and the second magnetic layer 30 formed with the amorphous phase does not have a crystal structure before the annealing is performed on the magnetic tunnel junction device, the first and second magnetic layers 10 and 30 do not have perpendicular magnetic anisotropy. Thus, as shown in FIG. 3, the magnetized moments of the first and second magnetic layers 10 and 30 are formed along the x-axis direction, that is, the in-plane direction.

Referring back to FIG. 2, the first magnetic layer 10, the insulating layer 20, and the second magnetic layer 30 manufactured through the above-described method are annealed in the step S40. While the first magnetic layer 10, the insulating layer 20, and the second magnetic layer 30 experience the annealing at a high temperature for a sufficient period of time, the first and second magnetic layers 10 and 30 having the chemical formula of $(A_{100-x}B_x)_{100-y}C_y$ may be recovered to the ordered crystal structure. In further detail, the annealing may be performed for several minutes to several hours at a temperature of 300° C. to 600° C. in order to prevent a deterioration of the magnetic tunnel junction device due to the diffusion of elements.

By the annealing, the amorphous ferromagnetic materials in the first and second magnetic layers 10 and 30, are transformed to the ordered crystal structure, and thereby obtain perpendicular magnetic anisotropy. That is, the magnetic tunnel junction device is manufactured by respectively depositing the first and second magnetic layers 10 and 30 in the amorphous phase and then the magnetic tunnel junction device is annealed according to the first exemplary embodiment of the present invention. Thus, by inducing perpendicular magnetic anisotropy of the first and second magnetic layers 10 and 30, the read signal value of the magnetic tunnel junction device 100 can be increased and thermal stability thereof can be increased with a small volume. Accordingly, the first magnetic layer 10, the second magnetic layer 30, and the insulating layer 20 with materials in the magnetic tunnel junction device 100 can provide the perpendicular magnetic anisotropy as well as excellent signal characteristics.

Figure 4:
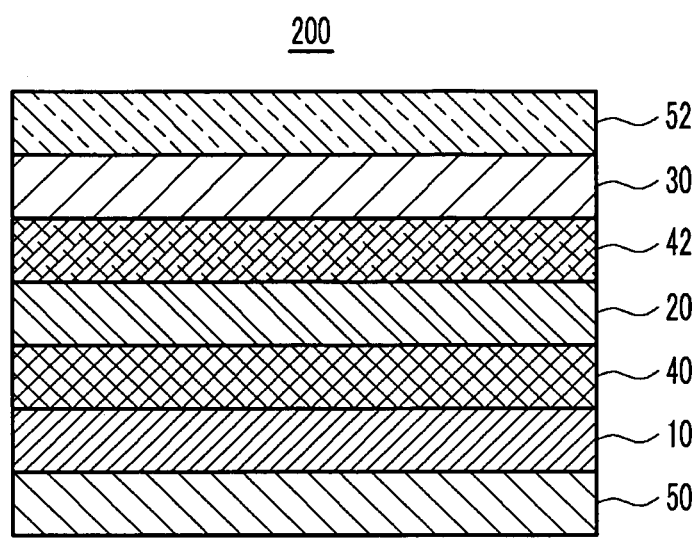
FIG. 4 schematically shows a cross-sectional view of a magnetic tunnel junction device according to a second exemplary embodiment of the present invention.

FIG. 4 schematically shows a cross-sectional view of a magnetic tunnel junction device 200 according to a second exemplary embodiment of the present invention. The magnetic tunnel junction device 200 of FIG. 4 is similar to the magnetic tunnel junction device 100 of FIG. 1, and therefore like reference numerals designate like elements and detailed description thereof will be omitted.

As shown in FIG. 4, the magnetic tunnel junction device 200 includes a first magnetic layer 10, an insulating layer 20, a second magnetic layer 30, in-plane magnetic layers with in-plane anisotropy, 40 and 42, and seed layers, for inducing the formation of crystalline structure, 50 and 52. The in-plane magnetic layers with in-plane anisotropy, 40 and 42, are used to compensate a large difference in crystal structure between the magnetic layers 10 and 30 and the insulating layer 20. In addition, the in-plane magnetic layers with in-plane anisotropy, 40 and 42, may be used to increase a read signal value of the magnetic tunnel junction device 200.

In this case, the insulating layer 20 is epitaxial to the in-plane magnetic layers with in-plane anisotropy, 40 and 42, and the first magnetic layer 10 and the second magnetic layer 30 are epitaxial to the seed layers 50 and 52. The first and second magnetic layers 10 and 30 having perpendicular anisotropy is not epitaxial to the in-plane magnetic layers with in-plane anisotropy, 40 and 42, but they are magnetically coupled thereto. Accordingly, the strong perpendicular anisotropy of the first and second magnetic layers 10 and 30 align the magnetic moments of the magnetic layer with in-plane anisotropy, 40 and 42, into out-of-plane direction, so that a tunnel magnetoresistance with perpendicular magnetization can be realized in the magnetic tunnel junction device 200.

The in-plane magnetic layers with in-plane anisotropy, 40 and 42, have a high spin polarization, and the lattice constants thereof are slightly different from that of the insulating layer 20. The in-plane magnetic layer with in-plane anisotropy, 40 and 42, may be formed of a material such as Fe, CoFe, or CoFeB.

In addition, the seed layers 50 and 52 induces the formation of crystalline structure in the first and second magnetic layers 10 and 30, which obtain an ordered crystal structure through annealing without contacting the insulating layer 20. For example, when the first magnetic layer 10 and the second magnetic layer 30 are formed of FePdB or FePtB, a seed layer 50 and 52 made of Pd, Pt, Au, or Fe is grown to have a (100) texture so as to induce the formation of an ordered crystalline structure in FePdB or FePtB.

As described above, although the first and second magnetic layers 10 and 30 and the insulating layer 20 are quite different from each other in crystal structure, the magnetic tunnel junction device 200 with perpendicular magnetization can be realized by using the in-plane magnetic layers with in-plane anisotropy, 40 and 42, and the seed layer, for inducing the formation of crystalline structures, 50 and 52.

Figure 5:
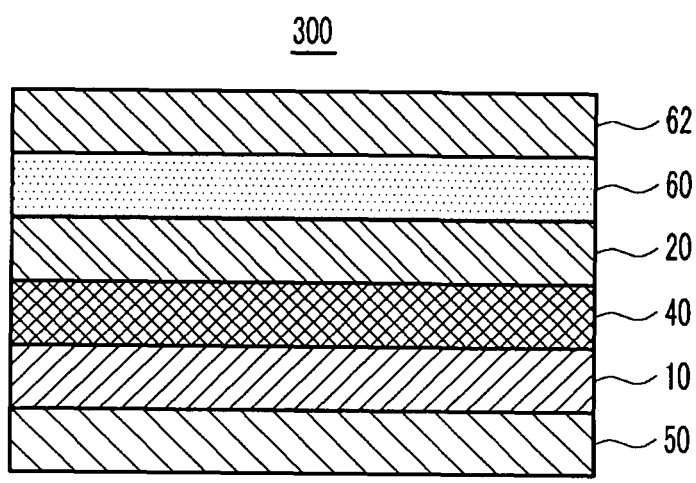
FIG. 5 schematically shows a cross-sectional view of a magnetic tunnel junction device according to a third exemplary embodiment of the present invention.

FIG. 5 schematically shows a cross-sectional view of a magnetic tunnel junction device 300 according to a third exemplary embodiment of the present invention. The magnetic tunnel junction device 300 of FIG. 5 is similar to the magnetic tunnel junction device 200 of FIG. 4, and therefore like reference numerals designate like elements and detailed description thereof will be omitted.

As shown in FIG. 5, the magnetic tunnel junction device 300 includes a first magnetic layer 10, an insulating layer 20, an in-plane magnetic layer with in-plane anisotropy 40, a seed layer 50 for inducing the formation of crystalline structure, an in-plane magnetic layer with in-plane anisotropy 60, and a perpendicular magnetic layer 62 for inducing perpendicular magnetization.

A structure of the insulating layer 20 of the magnetic tunnel junction device 300 of FIG. 5 is the same as that of the magnetic tunnel junction device 200, excluding an upper structure thereof.

As shown in FIG. 5, the magnetic tunnel junction device 300 may use an amorphous material at one electrode and a crystalline material at the other electrode in order to induce perpendicular magnetic anisotropy. After annealing, the amorphous material becomes the first perpendicular magnetic layer 10 and the crystalline material becomes the perpendicular magnetic layer 62 for inducing perpendicular magnetization in an in-plane magnetic layer 60. In FIG. 5, an amorphous material below the insulating layer 20 is used to induce perpendicular magnetization. In this case, the bottom electrode structure below the insulating layer 20 is the same as that of the magnetic tunnel junction device of FIG. 4.

As shown in FIG. 5, the in-plane magnetic layer with in-plane anisotropy 50 and the crystalline perpendicular magnetic layer 62 are formed on top of the insulating layer 20 in the magnetic tunnel junction device 300. For example, the in-plane magnetic layer with in-plane magnetic anisotropy 50 may be formed of a CoFeB alloy, and the crystalline perpendicular magnetic layer 62 for inducing perpendicular magnetization may be formed of a multi-layered Co/Pt alloy.

Hereinafter, the present invention will be described in further detail through experimental examples. The experimental examples are provided as examples of the present invention, and therefore the present invention is not limited thereto.

Experimental Example 1

A magnetic tunnel junction device was manufactured by sequentially stacking a magnetic layer, an insulating layer, and a magnetic layer. The magnetic layer was manufactured by adding 20 at % of boron to a $Fe_{50}Pd_{50}$ alloy having 1:1 element composition. The $Fe_{50}Pd_{50}$ alloy had an ordered crystal structure and perpendicular magnetic anisotropy. The magnetic layer was amorphized by adding boron. The thickness of the magnetic layer was 3 nm.

Next, the insulating layer was deposited on the magnetic layer. The insulating layer was formed of magnesium oxide, and had a thickness of 10 nm. The magnetic layer formed of $(Fe_{50}Pd_{50})_{80}B_{20}$ was deposited on the insulating layer.

Figure 6:
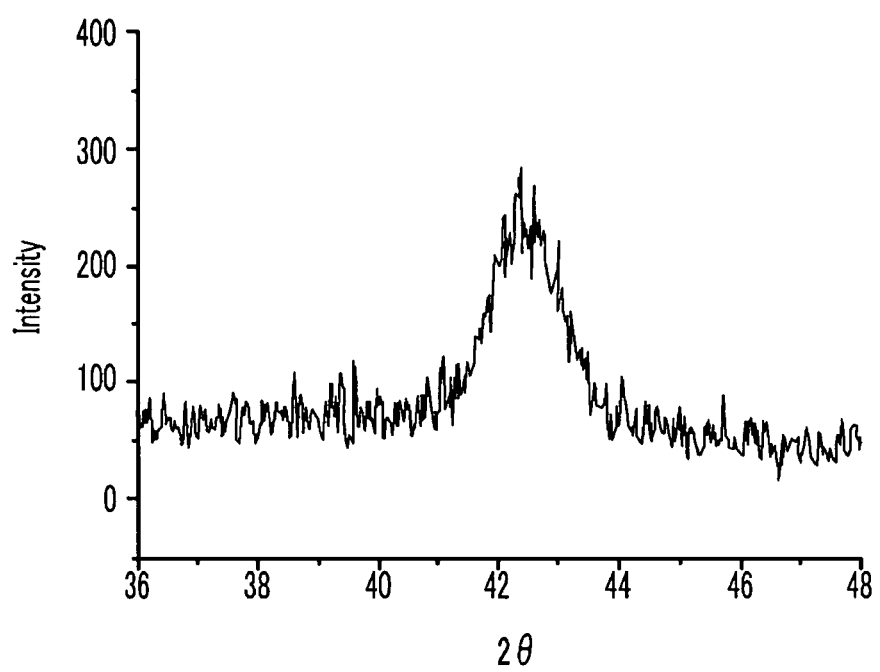
FIG. 6 is an X-ray diffraction graph of a magnetic tunnel junction device manufactured according to a first experimental example.

FIG. 6 shows an X-ray diffraction graph of a magnetic tunnel junction device manufactured according to Experimental Example 1.

As shown in FIG. 6, the X-ray diffraction peak was observed at a location where $2\theta$ is approximately 43°. This implies that MgO, that is, the insulating layer, was grown with a (001) orientation. Accordingly, it shows that the insulating layer was grown with a (001) orientation on the magnetic layer. In addition, since the insulating layer was deposited on the amorphous magnetic layer, it is predicted that the roughness of the insulating layer would be low.

Experimental Example 2

A Pt layer was deposited at 40 nm to have a (001) orientation on an MgO single crystal substrate having a (001) orientation. Here, the Pt layer had a thickness of 40 nm, and functioned as a seed layer for inducing the formation of ordered crystalline structure in an amorphous magnetic layer. Next, a magnetic layer formed of $(Fe_{50}Pd_{50})_{80}B_{20}$ was deposited in the amorphous phase on the Pt layer. The thickness of the $(Fe_{50}Pd_{50})_{80}B_{20}$ magnetic layer was 10 nm. The magnetic layer was deposited by sputtering and annealed for one hour at 500° C.

Figure 7:
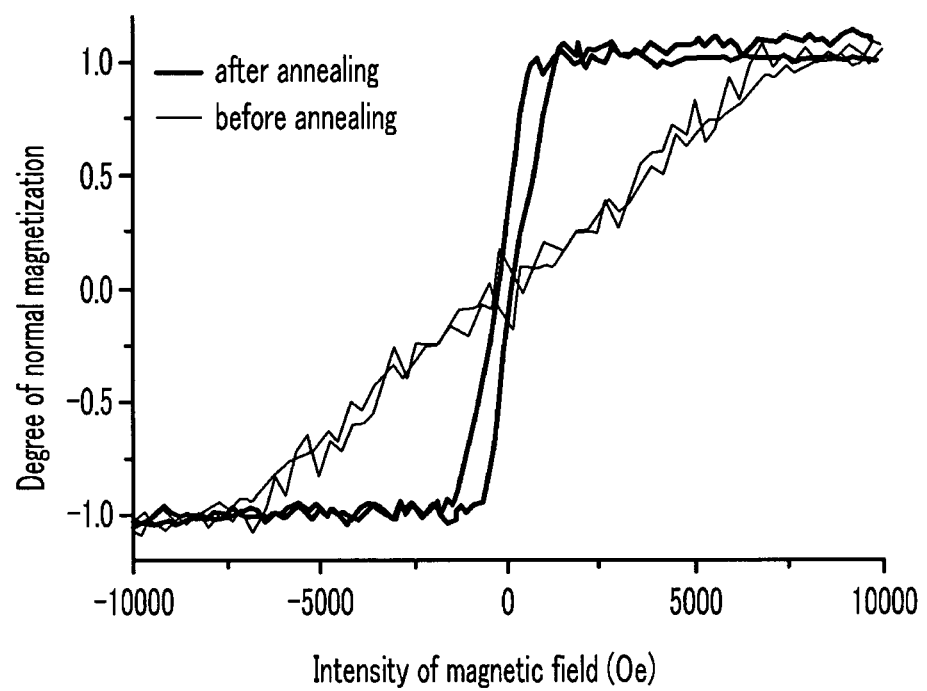
FIG. 7 is a magnetic hysteresis curve of a magnetic layer of a magnetic tunnel junction device manufactured according to a second experimental example before annealing and after annealing.

FIG. 7 shows a magnetic hysteresis curve of a magnetic layer of a magnetic tunnel junction device manufactured according to the second experimental example before annealing and after annealing. Here, the magnetic layer is formed of $(Fe_{50}Pd_{50})_{80}B_{20}$. In FIG. 7, the thin line shows a magnitude of perpendicular magnetization in the amorphous phase before annealing, and the thick line shows a magnitude of perpendicular magnetization in the state that an ordered crystal structure is recovered after annealing.

As shown in FIG. 7, the magnitude of perpendicular magnetization was increased in proportion to a magnetic field before the $(Fe_{50}Pd_{50})_{80}B_{20}$ magnetic layer is annealed, and the magnetization of the magnetic layer was saturated around 7000 Oe which is a value of a demagnetization field originated from the shape anisotropy of the thin film. A saturation magnetization of the $(Fe_{50}Pd_{50})_{80}B_{20}$ magnetic layer was 560 emu/cc, and the demagnetization field of the thin film was 7000 Oe. That is, because the magnetic layer formed of $(Fe_{50}Pd_{50})_{80}B_{20}$ does not have a crystal structure before the annealing, the magnetic layer had in-plane magnetic anisotropy without having perpendicular magnetic anisotropy. However, after the magnetic layer formed of $(Fe_{50}Pd_{50})_{80}B_{20}$ is annealed, the magnetization of the magnetic layer was saturated around 1000 Oe, which is smaller than 7000 Oe. That is, the perpendicular magnetic anisotropy was obtained as the ordered crystal structure of the $(Fe_{50}Pd_{50})_{80}B_{20}$ magnetic layer was recovered after the annealing.

Although this invention has been described in connection with what is presently considered to be practical exemplary embodiments, it is to be understood that the invention is not limited to the disclosed embodiments, but, by contrast, is intended to cover various modifications and equivalent arrangements included within the spirit and scope of the appended claims.

What is claimed is:

1. A magnetic tunnel junction data storage device comprising:
a first magnetic layer with a perpendicular magnetic anisotropy;
an insulating layer deposited on the first magnetic layer;
a second magnetic layer with a perpendicular magnetic anisotropy deposited on the insulating layer;
a first in-plane magnetic layer deposited between the second magnetic layer and the insulating layer; and
a first seed layer for inducing the formation of crystalline structure, deposited on the second magnetic layer wherein:
at least one of the first and second magnetic layers has a compound having a chemical formula of $(Fe_{100-x}Pd_x)_{100-y}B_y$ or $(Fe_{100-x}Pt_x)_{100-y}B_y$, B is a metal, and
the first seed layer for inducing the formation of crystalline structure is made at least one of Pd, Pt, Au, or Fe and has a (100) texture.

2. The magnetic tunnel junction data storage device of claim 1, wherein
the insulating layer includes a compound having a chemical formula of $D_{100-z}E_z$,
D is at least one element selected from a group consisting of lithium (Li), beryllium (Be), sodium (Na), magnesium (Mg), niobium (Nb), titanium (Ti), vanadium (V), tantalum (Ta), barium (Ba), palladium (Pd), zirconium (Zr), holmium (Ho), potassium (K), and silver (Ag), and
E is at least one element selected from a group consisting of oxygen (O), nitrogen (N), carbon (C), hydrogen (H), selenium (Se), chlorine (CO, and fluorine (F).

3. The magnetic tunnel junction data storage device of claim 1, wherein at least one of the first and second magnetic layers has a cubic or tetragonal structure.

4. The magnetic tunnel junction data storage device of claim 1, wherein the first in-plane magnetic layer comprises at least one element selected from a group consisting of Fe, CoFe, and CoFeB.

5. The magnetic tunnel junction data storage device of claim 1, further comprising:
a second in-plane magnetic layer deposited between the first magnetic layer and the insulating layer; and
a second seed layer, for inducing the formation of crystalline structure, deposited under the first magnetic layer.

6. A magnetic tunnel junction data storage device comprising:
a layer for inducing the formation of crystalline structure;
a magnetic layer with perpendicular magnetic anisotropy deposited on the layer for inducing the formation of crystalline structure;
a first in-plane magnetic layer deposited on the magnetic layer with perpendicular magnetic anisotropy;
an insulating layer deposited on the first in-plane magnetic layer;
a second in-plane magnetic layer deposited on the insulating layer; and
a perpendicular magnetic layer, for inducing perpendicular magnetic anisotropy, deposited on the second in-plane magnetic layer
wherein:
the magnetic layer with perpendicular magnetic anisotropy comprises a compound having a chemical formula of $(Fe_{100-x}Pd_x)_{100-y}B_y$ or $(Fe_{100-x}Pt_x)_{100-y}B_y$, B is a metal, and
the layer for inducing the formation of crystalline structure is made at least one of Pd, Pt, Au, or Fe and has a (100) texture.

\* \* \* \* \*